(12) United States Patent
Sessions

(10) Patent No.: US 6,459,277 B1
(45) Date of Patent: Oct. 1, 2002

(54) LINE IMPEDANCE CALIBRATION USING ACTUAL IMPEDANCE DETERMINATION

(75) Inventor: DC Sessions, Phoenix, AZ (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/727,751

(22) Filed: Dec. 1, 2000

(51) Int. Cl.[7] .................. G01R 35/00; G01R 27/02; H03H 7/38
(52) U.S. Cl. .................. 324/601; 324/605; 324/606; 333/124; 333/32
(58) Field of Search .................. 324/601, 606, 324/605, 647; 326/30; 327/108; 333/124, 32, 17.3

(56) References Cited

U.S. PATENT DOCUMENTS

| | | |
|---|---|---|
| 5,287,022 A | 2/1994 | Wilsher |
| 5,448,182 A | 9/1995 | Countryman et al. |
| 5,459,440 A | 10/1995 | Claridge et al. |
| 5,514,983 A | 5/1996 | Yoshino |
| 5,523,703 A * | 6/1996 | Yamamoto et al. .......... 326/30 |
| 5,559,441 A | 9/1996 | Desroches |
| 5,614,873 A | 3/1997 | Hageraats |
| 5,621,335 A | 4/1997 | Andresen |
| 5,771,262 A * | 6/1998 | Benayoun .................. 375/257 |
| 5,789,937 A | 8/1998 | Cao et al. |
| 5,793,223 A | 8/1998 | Frankeny |
| 5,942,922 A * | 8/1999 | Dinteman et al. .......... 327/108 |
| 6,049,221 A | 4/2000 | Ishibashi et al. |
| 6,051,989 A | 4/2000 | Walck |
| 6,118,384 A | 9/2000 | Sheldon et al. |

OTHER PUBLICATIONS

Pavincich, Marco, *Characteristic Impedance of Cables at High and Low Frequencies*, http://home.mira.net/~marcop/ciocahalf.htm., Sep. 7, 2000.

*Advanced Instrumentation for Solid State Applications* http://solartron.com/lap/techssi.htm., Sep. 7, 2000.

* cited by examiner

Primary Examiner—N. Le
Assistant Examiner—Anjan K. Deb
(74) Attorney, Agent, or Firm—Peter Zawilski

(57) ABSTRACT

An approach for impedance matching a transmission line includes using the actual line impedance. According to one example embodiment, the impedance of a line connecting first and second nodes is calibrated by first driving the line to a steady-state voltage using a first current having a magnitude greater than zero, driving the current to a zero magnitude from the first node and therein inducing a voltage transient. The resultant voltage level on the line at the first node is then measured and analyzed relative to a reference voltage. The result of the comparison is then used to adjust the conductance at the second node.

21 Claims, 2 Drawing Sheets

LINE IMPEDANCE CALIBRATION USING ACTUAL IMPEDANCE DETERMINATION

FIELD OF THE INVENTION

The present invention relates generally to transmission line impedance matching and, more particularly, to actual determination of the line impedance of a transmission line for signaling at nontrivial rates.

BACKGROUND OF THE INVENTION

Transmission line impedance matching is an important part of virtually every high-frequency circuit operation, including both analog and digital signal transmissions. For example, with the transmission of such signals over a simple conductor (which can be virtually any circuit bearing a signal-carrying path), the source and load ends (or "nodes") of the conductor should be properly terminated in order to prevent intolerable overshoot, undershoot, and reflections. In the presence of impedance mismatch, the severity of these undesirable effects increases with the length of the conductor, and the rate at which data can be transmitted over the conductor becomes more limited.

The impedance of both the source and load ends should be matched to the characteristic impedance of the conductor. The output impedance of the transmitting node and the input impedance of the receiving node typically differ from the characteristic impedance of the interconnecting transmission line, or the conductive path, carrying the signal. When the transmission line is used for bidirectional signal communication, it will be appreciated that each of the terminating nodes acts as a source when the node is sending a signal and each acts as a load when the node is receiving a signal, and a single impedance alteration does not typically provide the correct impedance matching for both transmission directions.

A multitude of techniques have been used to address impedance mismatch issues for a variety of applications including high-quality cable-matched interfaces, radio-frequency couplers, and large data networks using unshielded twisted pair cable. Many of these applications involve the transmission of signals at speeds that are sensitive, or "high" relative to the application's tolerance for the above-mentioned undesirable effects. Reliable signaling for these applications requires that the line drivers, the line terminators or both, be matched to the transmission line impedance. Because of the difficulty of determining the actual line impedance, the prevailing practice has been to specify values for the line, the drivers and the terminators independently and to trade off the loss of signal integrity from mismatches against the cost of reducing them. For example, in attempting to effect an impedance match between an I/O pin of an IC to a printed-circuit board conductor, it is common to approximate the nominal impedance of the conductor based on specified values of operation for the conductor and the circuits connected to either end, and then to terminate one of these ends with a resistor based on the approximated nominal impedance. This practice is disadvantageous, however, due to the inaccuracies ensuing from both the approximation and the specified values of operation.

Accordingly, there is a need for an improved transmission line impedance-matching technique that lessens the inaccuracies resulting from this trade off.

SUMMARY

According to various aspects of the present invention, embodiments thereof are exemplified in the form of methods and arrangements concerning approaches for line-impedance matching that involve a more direct manner of determining the line impedance for calibration purposes. It has been discovered that calibration of such a line can be achieved by appropriately adjusting the impedance at the signal terminating circuit in response to driving the line to a steady-state voltage using a first current, and then releasing this current and therein presenting a transient on the line. By properly evaluating the voltage level of the line in response to the transient, the proper adjustment can be made to the impedance at the signal terminating circuit.

Another specific implementation is directed to a process of calibrating impedance of a line connecting first and second nodes, comprising: driving the line to a steady-state voltage using a first current having a magnitude greater than zero; subsequently driving the current to a zero magnitude from the first node and therein presenting a transient voltage on the line; at the first node, indicating a voltage level of the line in response to the transient, comparing the line voltage level to a reference voltage, and then adjusting the impedance at the second node.

The above summary is not intended to provide an overview of all aspects of the present invention. Other aspects of the present invention are exemplified and described in connection with the detailed description.

BRIEF DESCRIPTION OF THE DRAWINGS

Various aspects and advantages of the present invention will become apparent upon reading the following detailed description of various embodiments and upon reference to the drawings in which.

Figure 1:
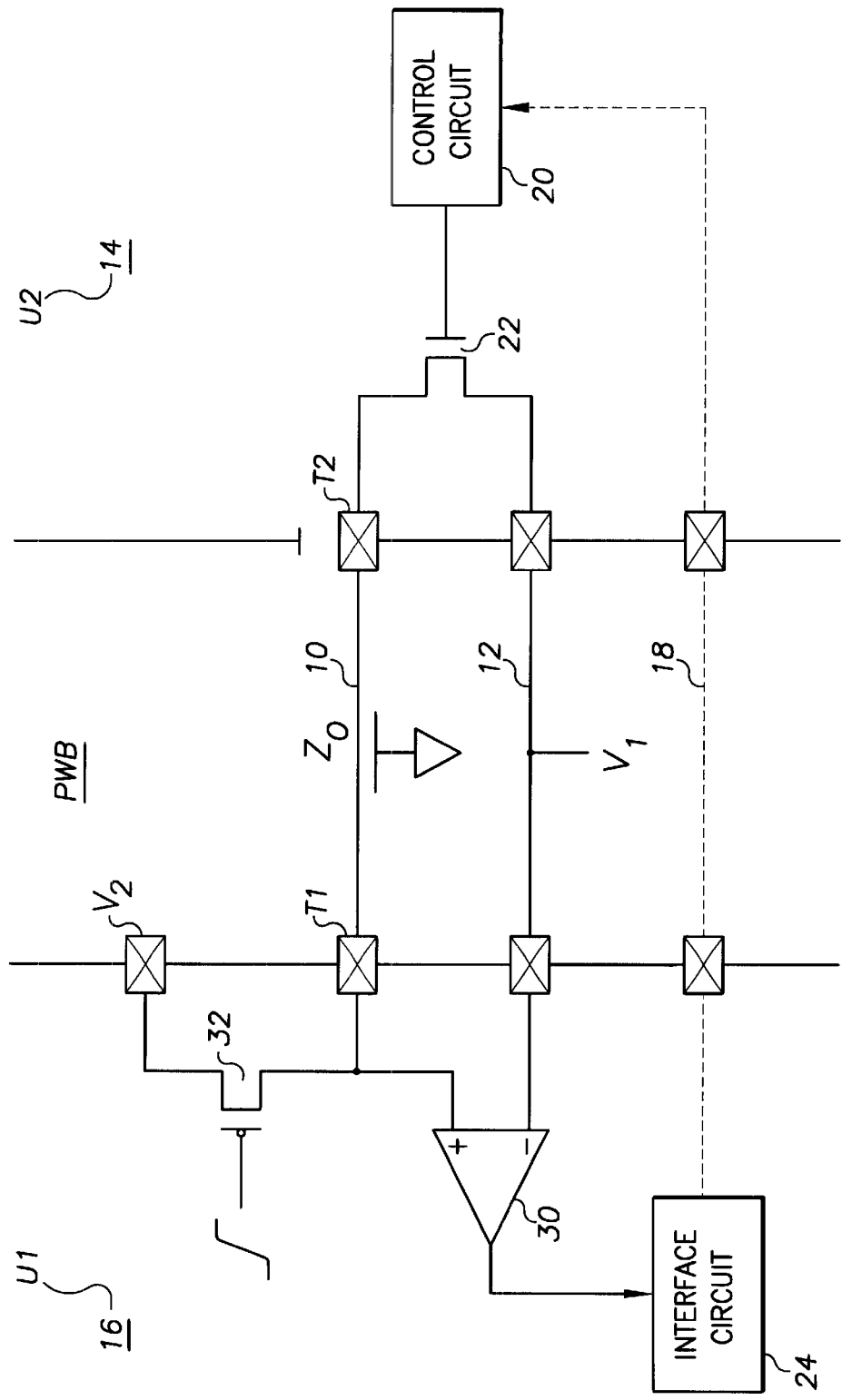
FIG. 1 is a block diagram of a transmission line impedance matching arrangement useful in illustrating a specific example implementation of the present invention.

While the invention is amenable to various modifications and alternative forms, specifics thereof have been shown by way of example in the drawings and will be described in detail. It should be understood, however, that the intention is not to limit the invention to any particular embodiment described. On the contrary, the intention is to cover all modifications, equivalents, and alternatives falling within the spirit and scope of the invention as defined by the appended claims.

DETAILED DESCRIPTION

The present invention has a variety of high-speed signaling applications where realizing precise matching of line impedance is beneficial. The present invention has been found to be advantageously useful for a wide variety of applications including, among many others, cable communications, various data-bussing arrangements, and the interconnection of two chips on a printed circuit/wire board. While the present invention is not necessarily limited to such applications, various aspects of the invention can be appreciated through a discussion of a few example embodiments relating to such environments.

One example embodiment of the present invention includes a signal driving circuit which is electrically connected to a far end termination circuit through a transmission line carrying signals at a relatively high speed. In this example application, it is important that the termination impedance matches the characteristic impedance ($Z_0$) of the line, which is dependent on the built-in and parasitic attributes of the line. Looking at the termination node from this perspective, these line attributes can be viewed as an equivalent circuit that includes the distributed series inductance and capacitance along the line length plus the parallel shunt capacitance and shunt conductance at the termination node. In connection with the present invention, it has been discovered that calibration of such a line can be achieved by appropriately adjusting the impedance at the termination circuit in response to driving the line to a steady-state voltage using a first current and then driving the current to a zero magnitude and therein presenting a transient on the line. By properly evaluating the voltage level of the line in response to the transient, achieved for example by comparing the line voltage level to a reference voltage, the proper adjustment can be made to the impedance at the far end circuit.

FIG. 1 illustrates another specific example embodiment of the present invention involving a printed wire board ("PWB") having communication channel 10 and termination potential 12 arranged to interconnect a signal driving circuit 14 with a terminating circuit 16. The first communication channel 10 corresponds to the transmission line, as discussed above, having characteristic impedance $Z_0$. The termination potential 12 is used to return signal current between the signal driving circuit 14 and the terminating circuit 16.

According to another aspect of the present invention, an optional second communication channel 18 is used to pass data for adjusting the impedance at the node interfacing the signal driving circuit 14 with the first communication channel 10. In various applications, the impedance at the node interfacing the signal driving circuit 14 is adjusted automatically using the third communication channel 18 as a feedback channel. In another approach, this impedance is adjusted less directly by further processing calibration data before adjusting the impedance either automatically or manually. The exact nature of the channel 18 is not significant to the invention.

In the example embodiment of FIG. 1, the second communication channel 18 is used to as an input for a control circuit 20 adapted to control a variable-impedance device 22 connected to a supply, depicted as V1. The variable-impedance device 22 may be of any sort, including but not limited to: a MOS transistor with substrate bias; a MOS transistor with analog gate-voltage control; a multiple MOS transistors with variable-number enablement; or a set of switchable resistors. An example circuit including a set of switchable (MOS-based or otherwise) resistors controlled by a CPU data bus is disclosed and described in connection with U.S. Pat. No. 6,118,384, entitled "Battery Monitor with Software Trim," to Sheldon et al. Thus, using a set of switchable resistors to define the impedance presented by the variable-impedance device 22, the control circuit 20 can be implemented using a port controlled by a CPU (internal to the block 20), or by discrete logic responding to the data fed back along the communication channel 18 and controlling a multi-bit state logic circuit such as a set of flip-flops. Any of the above approaches, and others, can be used as may be dictated by economics, technology availability, convenience, and/or the preference of the designer.

Accordingly, in response to certain conditions, the variable-impedance device 22 is adjusted to calibrate the impedance it presents to the first communication channel 10. These conditions are defined by analyzing the first communication channel 10 in response to the signal driving circuit 14 driving the line first to a steady-state voltage using a first current and then to a zero magnitude current. Releasing this drive induces a transient voltage that is evaluated to determine whether the impedance presented by the variable-impedance device 22 should be increased or decreased and/or the magnitude of such a change.

As shown in FIG. 1, the variable-impedance device 22 is controlled by using a comparator circuit 30 coupled to each of the first communication channel 10 and termination potential 12 to determine whether the impedance presented by the variable-impedance device 22 should be incremented or decremented by an amount as defined by the design of the control circuit 20. The voltage level of the line in response to the transient voltage is thus fed to the positive input port of the comparator circuit 30 and its negative input port is fed by the reference voltage V1 via the termination potential 12. By comparing the voltage level of the line to this reference voltage, the proper incremental adjustment can be made to the impedance at the signal driving circuit. In the illustrated example, FIG. 1 includes an optional interface circuit 24 for translating the voltage level at the output of the comparator circuit 30 to the control circuit 20. The exact location of the interface circuit is not critical nor is the implementation of the interface circuit 24. The location and implementation of each is determined by such design parameters as the levels presented at the output of the comparator circuit 30 and the input levels required by the control circuit 20. The comparator circuit 30 need only be fast enough to resolve the difference in a time frame that is short compared to the line propagation. In one example implementation, the comparator circuit 30 is implemented as a differential amplifier in which the output is in proportion to the differences between voltages applied to its two inputs.

The signal driving circuit 14 can also be implemented in different ways. As shown in FIG. 1, this current source for driving the first communications path 10 includes a switchable driver 32 that is capable of assuming both low-impedance and high-impedance states. The switchable driver 32 can be implemented, for example, by using: one or more MOS transistors configured as either common-drain or common-source; or one or more bipolar transistors configured as either grounded-emitter or grounded -collector. In this example illustration, the switchable driver 32 is shown representatively using a PMOS transistor (or as a set of common-source transistors) having its source terminal connected to a positive supply V2 and its drain terminal connected to the node interconnecting the positive input of the voltage comparator circuit 30 and termination potential 12.

In a more specific embodiment, the operation of the circuit of FIG. 1 commences with variable-impedance device 22 enabled and presenting an initial or default impedance value between the first communication path 10 and the termination potential 12. While not necessary for all applications, the initial or default impedance value can be approximated using conventional approaches and the incremental level and number of changes effected by the control circuit 20 can be minimized. The switchable driver 32 is also placed in a low-impedance state, thereby presenting an effective impedance R2 to the first communication path 10 and driving it to a steady-state value of $$V1+(R1*(V2-V1)/(R1+R2))$$

and passing a current of $$(V2-V1)/(R1+R2)$$

through the line. Once the current has settled, the switchable driver 32 is placed in a high-impedance state, therein forcing the line current to zero and inducing a transient voltage $Z_0*(V1-V2)/(R1+R2)$ on the line. This transient voltage will bring the line at the node T1 connecting to the negative input port of the comparator 30 to a potential defined by $V1+((R1-Z_0)*(V2-V1)/(R1+R2))$.

Assuming that V2>V1: if R1 equals $Z_0$, the voltage of the node T1 will be equal to V1, which is the threshold point for the comparator circuit 30. If R1 is greater then $Z_0$, the comparator circuit 30 will detect a positive difference, and if R1 is less than $Z_0$, the comparator circuit 30 will detect a negative difference. In response to this comparison, the interface circuit 24 causes the control circuit 20 to adjust the impedance of the variable-impedance device 22 for an improved interface between the impedance presented to by signal driving circuit 14 and the characteristic impedance of the line, or first communication path 10. The process can be repeated until an acceptable match is accomplished.

Since the devices at either end of the transmission line drive both high and low impedance levels, the variable-impedance device 22 may have a first complementary device (not shown) driving to V2 and the switchable driver 32 may have a second complementary device (not shown) driving to V1. The process for adjusting the first complementary device may be the complement of that discussed above for the illustrated variable-impedance device 22 or any of many alternative secondary calibration methods.

Figure 2:
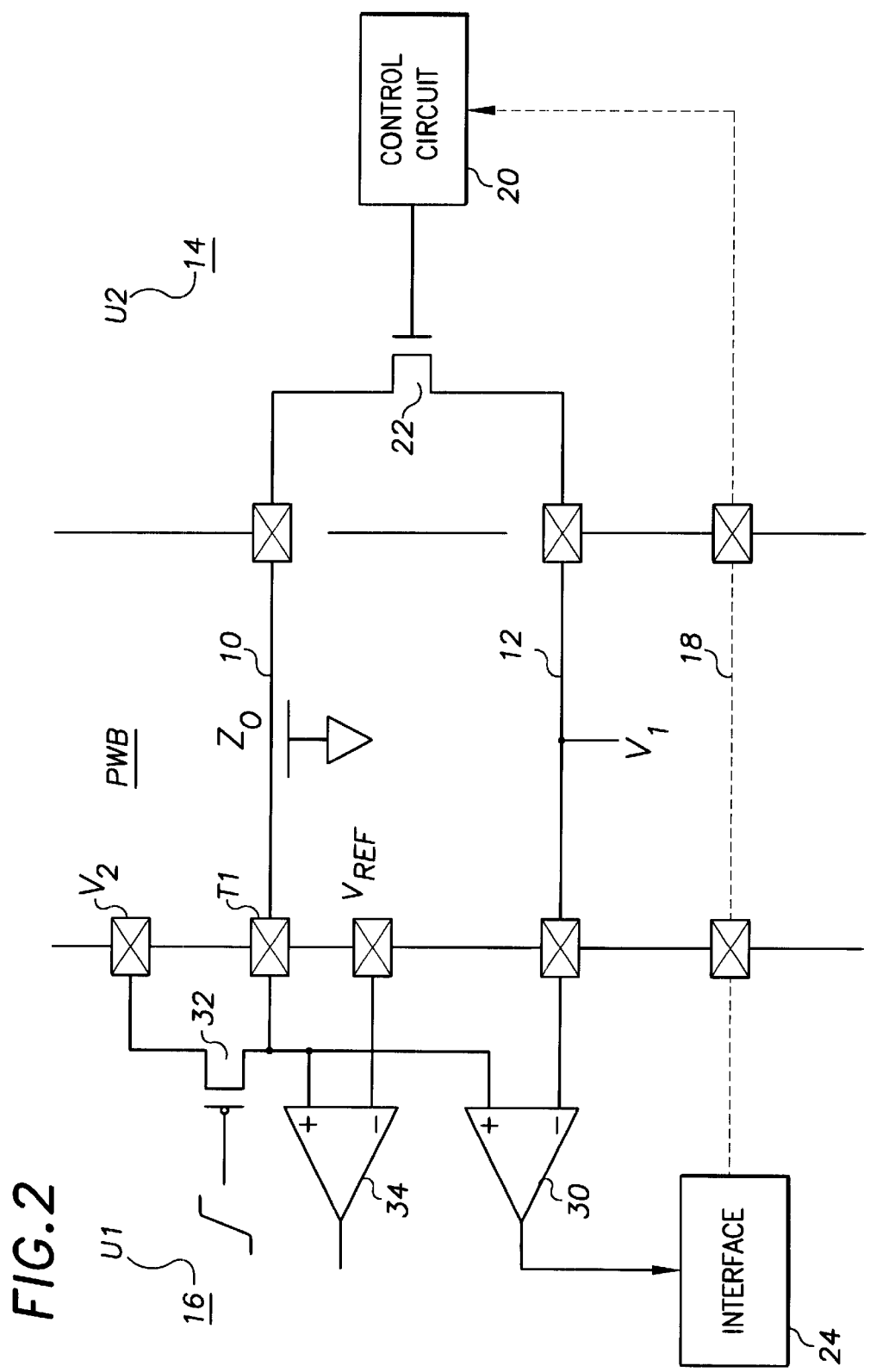
FIG. 2 is a diagram of another example circuit that is an alternative to the arrangement of FIG. 1 and is also in accordance with the present invention.

As a variation to the arrangement illustrated in FIG. 1, FIG. 2 illustrates an alternative embodiment that is useful for accommodating non-linearities in the variable-impedance device 22. Due to these non-linearities, it is helpful that its initial state be as near as possible to its normal operating point, which can be achieved by adjusting the strength of the switchable driver 32. This adjustment can be accomplished using a variety of approaches; as one example, a second comparator circuit 34 can be added as shown in FIG. 2. The output of the second comparator circuit 34 is used to adjust the initial potential at node T1 to $V_{REF}$ through a switchable bias circuit (not shown). When combined with the above-discussed first complementary device, this approach has the added benefit of matching the first complementary device to the line; the second comparator circuit 34 may also be used (and therefore already designed into the circuit) as a line receiver.

The various embodiments described above are provided by way of illustration only and are not intended to limit the invention. Those skilled in the art will readily recognize various modifications and changes that may be made to the present invention without strictly following the example embodiments and applications illustrated and described herein. For example, analyzing the line voltage relative to the reference voltage can be performed using means other than an analog comparator; alternatively, the corresponding signals can be translated to precise digital values and processing accordingly. These and other variations are considered to be aspects of the present invention as defined by the following claims.

What is claimed is:

1. A method of calibrating impedance of a line connecting first and second nodes, comprising:
   driving the line to a steady-state voltage using a first current having a magnitude greater than zero;
   subsequently driving the current to a zero magnitude from the first node and therein presenting a transient voltage on the line;
   at the first node, indicating a voltage level of the line in response to presenting a transient voltage on the line;
   analyzing the line voltage level relative to a reference voltage; and
   responsive to this comparison, adjusting the impedance at the second node.

2. The method of claim 1, wherein driving the line to a steady-state voltage includes presenting a relatively high conductance to the line, and wherein driving the current to a zero magnitude includes removing the relatively high conductance presented to the line.

3. The method of claim 2, further including providing a current driver circuit coupled to the line, and wherein presenting a relatively high conductance to the line includes controlling the current driver circuit.

4. The method of claim 2, further including providing a current driver circuit coupled to the line, and wherein removing the relatively high conductance presented to the line includes controlling the current driver circuit.

5. The method of claim 1, wherein adjusting the conductance at the second node further includes automatically adjusting the conductance of said at least one of the first and second nodes in response to a differential comparison of the line voltage level relative to the reference voltage.

6. The method of claim 5, wherein automatically adjusting the conductance includes feeding data back from the comparison to the second node.

7. The method of claim 5, further including using a conductance controller to adjust the conductance at the second node, and wherein feeding data back from the comparison includes feeding the data to the conductance controller.

8. The method of claim 1, further including providing a current driver circuit coupled to the line, and using the current driver circuit to control the conductance presented to the line.

9. A circuit arrangement including a line connecting first and second nodes, the arrangement comprising:
   means for driving the line to a steady-state voltage using a first current having a magnitude greater than zero;
   means for driving the current to a zero magnitude from the first node therein presenting a transient voltage on the line;
   means for indicating a voltage level of the line at the first node in response to presenting a transient voltage on the line;
   means for analyzing the line voltage level relative to a reference voltage; and
   means, responsive to the analysis means, for adjusting the impedance at the second node.

10. The circuit arrangement of claim 9, further including first means for controlling conductance presented to the line.

11. The circuit arrangement of claim 9, further including a comparator circuit.

12. The circuit arrangement of claim 11, wherein the comparator circuit includes a differential amplifier.

13. A circuit arrangement including a line connecting first and second nodes, the arrangement comprising:
   a selectively controllable current source coupled to the line and adapted to drive the line to a steady-state voltage using a first current having a magnitude greater than zero, the selectively controllable current source including a control port adapted to receive a selectively provided input, the selectively controllable current source further adapted to respond to the selectively provided input by driving the current to a zero magnitude from the first node and presenting a transient voltage on the line;

a comparison circuit, responsive to the line current for indicating a voltage level of the line at the first node and responsive to a reference voltage, the comparison circuit adapted to indicate magnitude of the line voltage level relative to the reference voltage; and a selectable impedance circuit adapted to respond to this comparison by adjusting the conductance at the second node.

14. The circuit arrangement of claim 13, wherein the selectively controllable current source comprises a transistor circuit including the control port, and wherein the transistor circuit is adapted to respond to a bi-level signal by activating and deactivating the source according to the state of the bi-level signal.

15. The circuit arrangement of claim 13, wherein the selectively controllable current source is further adapted to control conductance presented to the line.

16. The circuit arrangement of claim 15, wherein the selectively controllable current source is further adapted to remove a high conductance presented to the line.

17. The circuit arrangement of claim 13, further including a feedback path adapted to carry a signal from the comparison circuit to the selectable impedance circuit.

18. The circuit arrangement of claim 17, wherein the feedback path and the comparison circuit are adapted to automatically cause the selectable impedance circuit to adjust the conductance.

19. For use in calibrating a transmission line connecting first and second nodes, a circuit arrangement comprising:

a selectively controllable current source coupled to the line and adapted to drive the line to a steady-state voltage using a first current having a magnitude greater than zero, the selectively controllable current source including a control port adapted to receive a selectively provided input, the selectively controllable current source further adapted to respond to the selectively provided input by driving the current to a zero magnitude from the first node and presenting a transient voltage on the line;

a comparison circuit, responsive to the line current for indicating a voltage level of the line at the first node and responsive to a reference voltage, the comparison circuit adapted to indicate magnitude of the line voltage level relative to the reference voltage; and wherein a conductance at the second node is altered in response to the magnitude indication.

20. The circuit arrangement of claim 19, further comprising a selectively controllable current source coupled to the line and adapted to adjust the conductance of the source.

21. The circuit arrangement of claim 19, wherein the comparison circuit includes a differential amplifier.

* * * * *